United States Patent
Hung et al.

(10) Patent No.: US 9,064,879 B2
(45) Date of Patent: Jun. 23, 2015

(54) PACKAGING METHODS AND STRUCTURES USING A DIE ATTACH FILM

(75) Inventors: Jui-Pin Hung, Hsin-Chu (TW); Jing-Cheng Lin, Hsin-Chu (TW); Nai-Wei Liu, Fengshan (TW); Chin-Chuan Chang, Zhudong Township (TW); Chen-Hua Yu, Hsin-Chu (TW); Shin-Puu Jeng, Hsin-Chu (TW); Chin-Fu Kao, Taipei (TW); Yi-Chao Mao, Zhongli (TW); Szu Wei Lu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 89 days.

(21) Appl. No.: 13/228,244

(22) Filed: Sep. 8, 2011

(65) Prior Publication Data

US 2013/0062760 A1    Mar. 14, 2013

(51) Int. Cl.
*H01L 21/44* (2006.01)
*H01L 21/48* (2006.01)
(Continued)

(52) U.S. Cl.
CPC ............ *H01L 21/561* (2013.01); *H01L 23/3114* (2013.01); *H01L 21/568* (2013.01); *H01L 24/19* (2013.01); *H01L 2224/83191* (2013.01); *H01L 23/147* (2013.01); *H01L 23/49816* (2013.01); *H01L 23/49827* (2013.01); *H01L 23/5389* (2013.01); *H01L 24/20* (2013.01); *H01L 2224/12105* (2013.01); *H01L 2224/73267* (2013.01); *H01L 2924/18162* (2013.01); *H01L 2224/05569* (2013.01); *H01L 24/13* (2013.01); *H01L 21/6836* (2013.01); *H01L 24/81* (2013.01); *H01L 24/96* (2013.01); *H01L 24/97* (2013.01); *H01L 2221/68345* (2013.01); *H01L 2221/68359* (2013.01); *H01L 2221/68377* (2013.01); *H01L 2224/05008* (2013.01); *H01L 2224/05022* (2013.01); *H01L 2224/13022* (2013.01); *H01L 2224/96* (2013.01); *H01L 2224/97* (2013.01); *H01L 2924/18161* (2013.01);
(Continued)

(58) Field of Classification Search
CPC ............................ H01L 21/561; H01L 21/568
USPC ........... 438/113; 257/738, E21.508, E21.502, 257/E23.069
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

JP    2005-264122    * 9/2005

OTHER PUBLICATIONS

"Polymer," Wikipedia, the free encyclopedia, online, downloaded Jun. 22, 2011, 16 pgs., http://en.wikipedia.org/wiki/Polymer.
(Continued)

*Primary Examiner* — David S Blum
(74) *Attorney, Agent, or Firm* — Slater & Matsil, L.L.P.

(57) ABSTRACT

Packaging methods and structures for semiconductor devices that utilize a novel die attach film are disclosed. In one embodiment, a method of packaging a semiconductor device includes providing a carrier wafer and forming a die attach film (DAF) that includes a polymer over the carrier wafer. A plurality of dies is attached to the DAF, and the plurality of dies is packaged. At least the carrier wafer is removed from the packaged dies, and the packaged dies are singulated.

20 Claims, 9 Drawing Sheets

(51) Int. Cl.
| | |
|---|---|
| *H01L 21/50* | (2006.01) |
| *H01L 23/48* | (2006.01) |
| *H01L 23/52* | (2006.01) |
| *H01L 29/40* | (2006.01) |
| *H01L 21/56* | (2006.01) |
| *H01L 23/14* | (2006.01) |
| *H01L 23/498* | (2006.01) |
| *H01L 23/538* | (2006.01) |
| *H01L 21/683* | (2006.01) |
| *H01L 23/31* | (2006.01) |
| *H01L 23/00* | (2006.01) |

(52) U.S. Cl.
CPC ............. *H01L 2224/11002* (2013.01); *H01L 2224/05572* (2013.01); *H01L 2224/05099* (2013.01); *H01L 2224/05599* (2013.01); *H01L 2224/16227* (2013.01)

(56) References Cited

U.S. PATENT DOCUMENTS

| | | | |
|---|---|---|---|
| 5,075,253 A | 12/1991 | Sliwa, Jr. | |
| 5,250,843 A | 10/1993 | Eichelberger | |
| 5,380,681 A | 1/1995 | Hsu | |
| 5,481,133 A | 1/1996 | Hsu | |
| 5,844,315 A | 12/1998 | Melton et al. | |
| 6,002,177 A | 12/1999 | Gaynes et al. | |
| 6,087,202 A * | 7/2000 | Exposito et al. | 438/113 |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,538,317 B1 | 3/2003 | Miyata | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,138,711 B2 * | 11/2006 | Yee et al. | 257/720 |
| 7,144,800 B2 * | 12/2006 | Mostafazadeh et al. | 438/598 |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,388,293 B2 | 6/2008 | Fukase et al. | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,750,459 B2 | 7/2010 | Dang et al. | |
| 7,776,649 B1 * | 8/2010 | Fan | 438/106 |
| 7,825,520 B1 * | 11/2010 | Longo et al. | 257/777 |
| 7,834,450 B2 | 11/2010 | Kang | |
| 7,893,542 B2 | 2/2011 | Tachibana et al. | |
| 8,048,781 B2 * | 11/2011 | How | 438/464 |
| 8,105,875 B1 | 1/2012 | Hu et al. | |
| 8,183,677 B2 * | 5/2012 | Meyer-Berg | 257/686 |
| 8,188,593 B2 | 5/2012 | Chen et al. | |
| 8,216,918 B2 * | 7/2012 | Gong et al. | 438/464 |
| 8,309,454 B2 * | 11/2012 | Brunnbauer et al. | 438/622 |
| 8,319,349 B2 | 11/2012 | Hu et al. | |
| 2003/0230813 A1 | 12/2003 | Hirano et al. | |
| 2004/0161876 A1 * | 8/2004 | Tandy et al. | 438/106 |
| 2004/0207094 A1 | 10/2004 | Sugizaki et al. | |
| 2008/0136009 A1 * | 6/2008 | Theuss et al. | 257/690 |
| 2010/0013081 A1 | 1/2010 | Toh et al. | |
| 2010/0015784 A1 * | 1/2010 | Nakamura et al. | 438/464 |
| 2010/0044853 A1 | 2/2010 | Dekker et al. | |
| 2010/0140805 A1 | 6/2010 | Chang et al. | |
| 2010/0193923 A1 * | 8/2010 | Tanaka et al. | 257/676 |
| 2010/0200992 A1 | 8/2010 | Purushothaman et al. | |
| 2010/0216281 A1 | 8/2010 | Pagaila et al. | |
| 2010/0248452 A1 * | 9/2010 | Saito et al. | 438/464 |
| 2010/0279467 A1 * | 11/2010 | Magnus et al. | 438/113 |
| 2010/0327439 A1 | 12/2010 | Hwang et al. | |
| 2011/0062592 A1 | 3/2011 | Lee et al. | |
| 2011/0111563 A1 * | 5/2011 | Yanagi et al. | 438/118 |
| 2011/0217814 A1 * | 9/2011 | Gao et al. | 438/113 |
| 2011/0241222 A1 * | 10/2011 | Sezi et al. | 257/782 |
| 2011/0254157 A1 * | 10/2011 | Huang et al. | 257/737 |
| 2011/0266701 A1 * | 11/2011 | Wan et al. | 257/782 |
| 2011/0291288 A1 | 12/2011 | Wu et al. | |
| 2012/0018897 A1 | 1/2012 | Park et al. | |
| 2012/0038044 A1 * | 2/2012 | Chang et al. | 257/738 |
| 2012/0070960 A1 * | 3/2012 | Murata et al. | 438/464 |
| 2012/0104578 A1 | 5/2012 | Hu et al. | |
| 2012/0139120 A1 * | 6/2012 | Chow et al. | 257/773 |
| 2012/0235309 A1 * | 9/2012 | Essig et al. | 257/782 |
| 2012/0270381 A1 * | 10/2012 | Joo et al. | 438/460 |
| 2012/0309130 A1 * | 12/2012 | Hin et al. | 438/113 |
| 2013/0049205 A1 * | 2/2013 | Meyer et al. | 257/773 |
| 2013/0203215 A1 | 8/2013 | Hung et al. | |

OTHER PUBLICATIONS

"Thermoplastic," Wikipedia, the free encyclopedia, online, downloaded Jun. 22, 2011, 1 pg., http://en.wikipedia.org/wiki/Thermoplastic.

* cited by examiner

PACKAGING METHODS AND STRUCTURES USING A DIE ATTACH FILM

CROSS-REFERENCE TO RELATED APPLICATIONS

This application relates to the following co-pending and commonly assigned patent application: Ser. No. 12/904,835, filed on Oct. 14, 2010, entitled, "Approach for Bonding Dies onto Interposers," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Thus, packages such as wafer level packaging (WLP) have begun to be developed, in which integrated circuits (ICs) are placed on a carrier having wiring for making connection to the ICs and other electrical components. In an attempt to further increase circuit density, three-dimensional (3D) ICs have also been developed, in which two dies or ICs are bonded together electrical connections are formed between the dies and contact pads on a substrate. These relatively new types of packaging for semiconductors face manufacturing challenges such as poor adhesion between the IC and carriers, sidewall chipping, warpage, die shifting, poor moisture and photo pollution, and other reliability issues.

Thus, what are needed in the art are improved packaging techniques for today's small scale ICs, 3DICs, and other semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 11 through 20 illustrate cross-sectional views of a method of packaging a semiconductor device in a 3DIC chip-on-wafer package utilizing a die attach film (DAF) at various stages in accordance with another embodiment of the present disclosure.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to the use of a novel DAF to attach dies to a carrier wafer for various packaging processing steps and semiconductor applications. Two embodiments will be described herein: 1) the use of the DAF in a FO-WLP (FIGS. 1-10); and 2) the use of the DAF in a 3DIC chip-on-wafer assembly (FIGS. 11-20). However, the novel DAF described herein may be used in other planar and stacked semiconductor device packaging applications.

Figure 1:
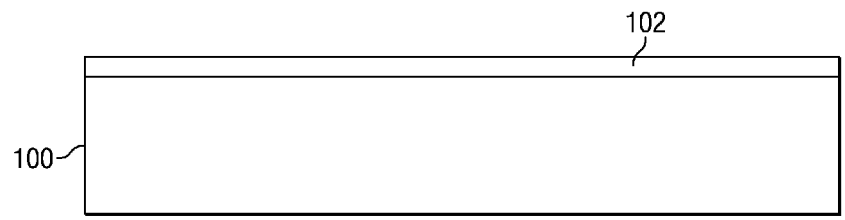
FIGS. 1 through 9 show cross-sectional views of a method of packaging a semiconductor device in a fan-out wafer level package (FO-WLP) utilizing a DAF at various stages in accordance with an embodiment of the present disclosure.

FIGS. 1 through 9 show cross-sectional views of a method of packaging a semiconductor device in a FO-WLP utilizing a DAF at various stages in accordance with an embodiment of the present disclosure. Referring first to FIG. 1, a carrier wafer 100 is provided. The carrier wafer 100 may comprise glass, silicon oxide, aluminum oxide, and the like, as examples. The carrier wafer 100 thickness may be between about a few mils to several tens of mils and may comprise a diameter of about 300 mm in some embodiments. The carrier wafer 100 functions as a fan-out carrier wafer during the packaging of semiconductor devices or dies 104 (see FIG. 2).

A DAF 102 is formed over the carrier wafer 100, as shown in FIG. 1. The DAF 102 comprises a polymer and in some embodiments comprises a thermoplastic material. The DAF 102 may be liquid, e.g., a thick liquid, when applied but forms a solid at room temperature. The DAF 102 material may become semi-liquid when heated and may become sticky to function as an adhesive at elevated temperatures. The DAF 102 may comprise a polymer-based film that functions as an adhesive when heated, in some embodiments, for example.

The DAF 102 may comprise a thermoplastic material, such as epoxy resin, phenol resin, or poly-olefin, as examples, although alternatively, other thermoplastic materials or polymers compatible with semiconductor processing environments may be used. The DAF 102 may be applied to the carrier wafer 100 using a lamination process and may comprise a thickness of about 10 μm, for example. Alternatively, the DAF 102 may be applied by other techniques and may comprise other dimensions.

Figure 2:
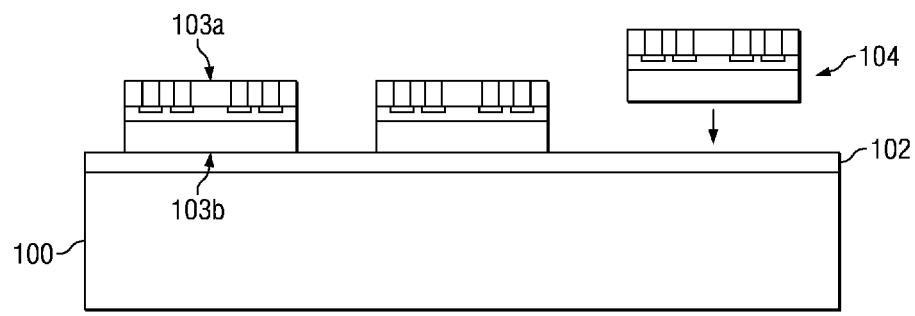

Next, a plurality of dies 104 is attached to the DAF 102, as shown in FIG. 2. Several dozen dies 104 or several hundred dies 104 or more may be attached to the DAF 102, depending on the size of the dies 104, the size of carrier wafer 100, and the particular application, as examples. The dies 104 have a front side 103a and a back side 103b for purposes of discussion herein. The front side 103a of the dies 104 is also referred to herein as a first side, and the back side 103b is also referred to herein as a second side. The dies 104 comprise semiconductor devices or integrated circuits that have been previously manufactured on a semiconductive substrate. The dies 104 may comprise one or more layers of electrical circuitry and/or electronic functions formed thereon, and may include conductive lines, vias, capacitors, diodes, transistors, resistors, inductors, and/or other electrical components, for example (not shown). The dies 104 have been singulated from the substrate they were manufactured on and are ready for packaging. A pick and place machine may be used to place the dies 104 in predetermined locations on the carrier wafer 100, for example. The back sides 103b of the dies 104 are attached to the DAF 102, as shown in FIG. 2.

In accordance with embodiments of the present disclosure, a glue is not required or used to attach the plurality of dies 104 to the carrier wafer 100. Rather, the DAF 102 functions as an adhesive mechanism to adhere the dies 104 to the carrier wafer 100. To attach the dies 104 to the DAF 102, heat is applied to the DAF 102, e.g., to the carrier wafer 100, DAF 102, and dies 104, after or while the dies 104 are placed on the DAF 102. In some embodiments, the heat applied may comprise a temperature of about 150 to 270 degrees C. for about 1 second to 2 minutes, to activate the adhesive properties of the DAF 102. In other embodiments, the DAF 102 may be adapted to comprise a semi-liquid adhesive when heated to a temperature of about 150 degrees C. or greater, as another example. Pressure may also be applied to the DAF 102, e.g., from the carrier wafer 100 upwardly to the dies 104, from the dies 104 downwardly to the carrier wafer 100, or a combination thereof. The pressure application for the DAF 102 may comprise about 1 Newton (N) or greater, as an example, although alternatively, other amounts of pressure may also be applied.

When the DAF 102 is returned to room temperature, the DAF 102 returns to a solid and the dies 104 are securely positioned in their predetermined locations on the carrier wafer 100. The dies 104 are positioned such that they are spaced apart from one another by a predetermined distance sufficient for the packaging process, as shown.

Figure 3:
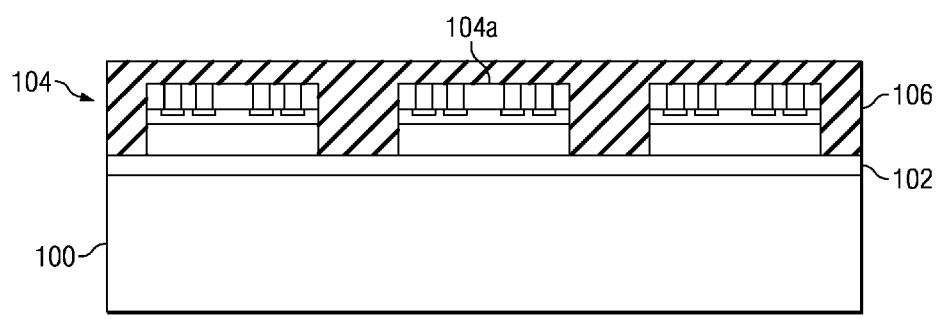
Figure 4:
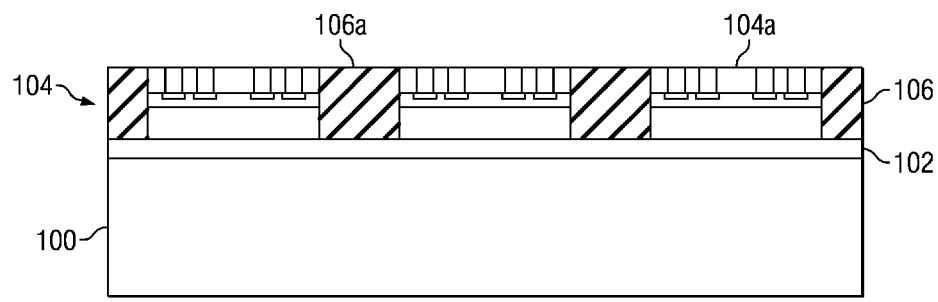

Next, a packaging process is performed to package each of the plurality of dies 104. In the embodiment shown in FIGS. 1 through 10, to package the dies 104, first, a molding compound 106 is formed over the plurality of dies 104 and over exposed portions of the DAF 102, as shown in FIG. 3. The molding compound 106 may be molded onto the dies 104 and DAF 102 over the carrier wafer 100, as shown. The top surface of molding compound 106 may be higher than (as shown in FIG. 3), level with (as shown in FIG. 4), or slightly lower than, top surfaces 104a of the dies 104. The molding compound 106 fills into the gaps between the plurality of dies 104, as shown.

Next, a grinding process may be performed to planarize the top surfaces 104a of the plurality of dies 104, so that any unevenness in the top surfaces 104a of the dies 104 may be at least reduced, and possibly substantially eliminated. If the molding compound 106 comprises portions on the top surfaces 104a of the dies 104, these portions of molding compound 106 are also removed by the grinding process, as shown in FIG. 4. Accordingly, the top surfaces 106a of the remaining portions of the molding compound 106 are level with top surfaces 104a of the plurality of dies 104. Furthermore, the height or thickness of the plurality of dies 104 may also be reduced to a desirable height through the grinding process.

Figure 5:
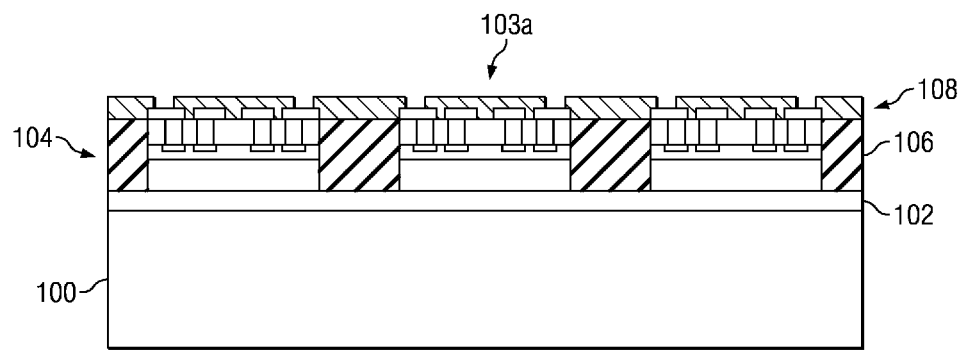
Figure 6:
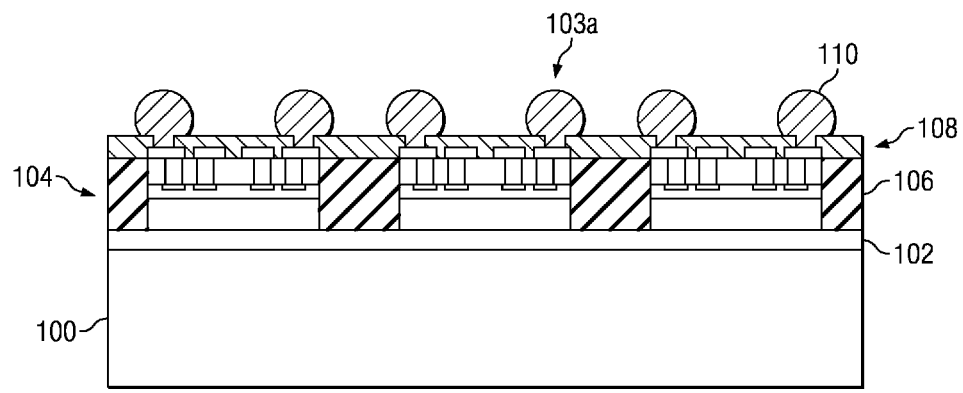

A wiring layer 108 is formed over the top surfaces 104a of the plurality of dies 104, e.g., on the front sides 103a of the dies 104, as shown in FIG. 5. The wiring layer 108 may comprise a redistribution layer (RDL), to be described further herein with respect to FIG. 9. The structure shown in FIG. 5 comprises a reconstructed wafer over the carrier wafer 100 that includes the plurality of dies 104, for example. A plurality of solder balls 110 is formed over portions of the wiring layer 108, as shown in FIG. 6. The packaged dies 104 may optionally be tested, e.g., to perform electrical and functional tests at this stage of the manufacturing and packaging process.

The packaged dies comprise the molding compound 106, wiring layer 108, solder balls 110, and also the DAF 102 in some embodiments. In other embodiments, the DAF 102 is removed, and the packaged dies comprise the molding compound 106, wiring layer 108, and solder balls 110.

Figure 7:
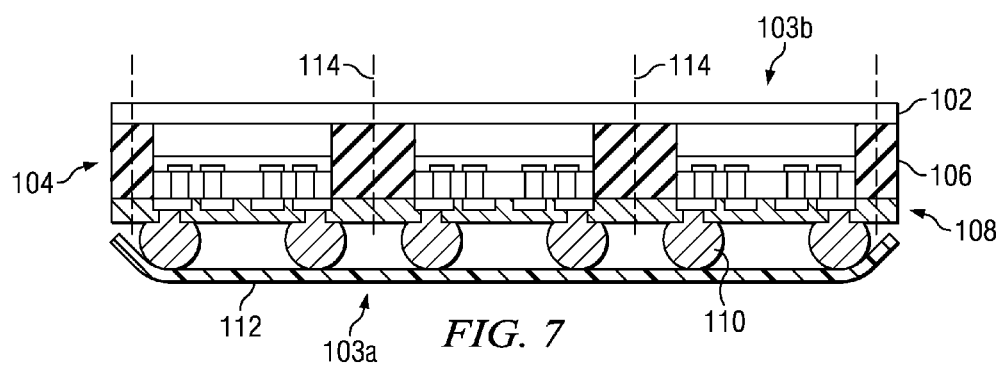

Next, at least the carrier wafer 100 is removed from the packaged dies 104, as shown in FIG. 7. The molding compound 106 and wiring layer 108 support the dies 104 during the debonding process of the carrier wafer 100 from the packaged dies 104, for example. In the embodiment shown in FIGS. 1 through 10, the DAF 102 is left remaining on the back sides 103b of the dies 104, as shown. Alternatively, the DAF 102 may be removed when the carrier wafer 100 is removed or in a separate processing step, e.g., using light (laser) or a thermal process.

Figure 8:
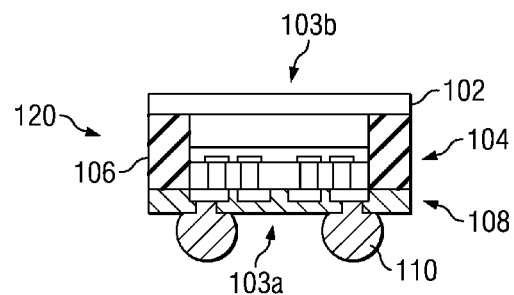

The packaged dies 104 are then singulated or separated at singulation lines 114, forming individual packaged dies 104, also referred to herein as packaged semiconductor devices 120, as shown in FIG. 8. The molding compound 106 is disposed between the wiring layer 108 and the DAF 102 proximate edges of the die 104 within the packaged semiconductor device 120, which protects the edges of the die 104. To singulate the packaged dies 104 from adjacent packaged dies 104, tape 112 may be applied to the solder balls 110 on the front sides 103a of the dies 104, also shown in FIG. 7. The tape 112 comprises dicing tape that supports the packaged dies 104 during the singulation process. The packaged semiconductor devices 120 are then removed from the tape 112, shown in FIG. 8.

Figure 9:
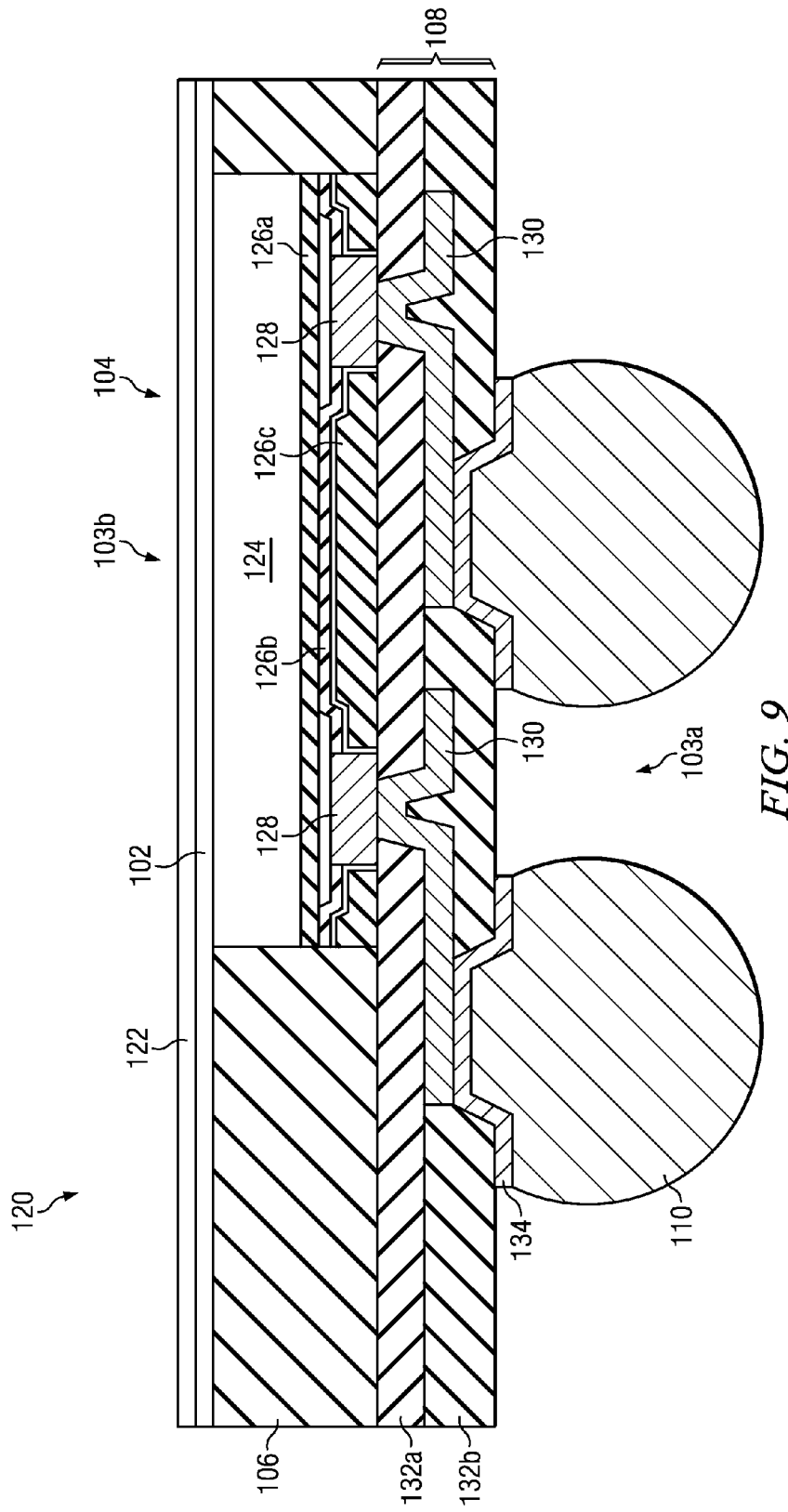

FIG. 9 shows a more detailed cross-sectional view of the packaged semiconductor device 120 shown in FIG. 8. FIG. 9 also shows an optional tape 122 that may be applied over the DAF 102 after the carrier wafer 100 is removed. The optional tape 122 may comprise a marking tape that is adapted to be marked with laser marking in some embodiments. In other embodiments, the DAF 102 may comprise a material that is adapted to be marked, e.g., with a laser, and the tape 122 may not be included in the structure. After the formation of the solder balls 110, testing may be performed on the die 104, and the tape 122 or DAF 102 may be marked to indicate results of the tests, for example. The packaged dies 104 may alternatively be marked before or after singulation for a variety of other reasons.

FIG. 9 also shows a more detailed view of the die 104 and the wiring layer 108. The more detailed view of the die 104 and wiring layer 108 are exemplary; alternatively, the die 104 and wiring layer 108 may comprise other configurations, layouts and/or designs. In the embodiment shown, the die 104 includes a substrate 124 comprising silicon or other semiconductive materials. Insulating layers 126a and 126b may comprise passivation layers disposed on the substrate 124. Contact pads 128 of the die 104 may be formed over conductive features of the substrate such as metal and/or semiconductive pads, plugs, vias, or conductive lines to make electrical contact with active features of the substrate 124, not shown. The contact pads 128 may be formed in an insulating layer 126c that may comprise a polymer layer or other insulating materials.

The wiring layer 108 may include insulating layers 132a and 132b that comprise polymers or other insulating materials. An RDL 130 may be formed within the insulating layers 132a and 132b, as shown, with portions of the RDL 130 making electrical contact with contact pads 128 on the die 104. An optional under bump metallization (UBM) structure 134 may be formed on portions of the RDL 130 and insulating layer 132b, as shown. The UBM structure 134 facilitates in the connections and formation of the solder balls 110, for example.

The presence of the novel DAF 102 on the back side 103b of the packaged semiconductor device 120 is advantageous for several reasons. First, the DAF 102 provides back side 103b protection; e.g., the substrate 124 of the die 104 and the molding compound 106 are protected by the DAF 102. The DAF 102 comprises at least a portion of the package of the semiconductor device or die 104 in some embodiments, for example. The DAF 102 improves adhesion between the die 104 and the carrier wafer 100 during the packaging process. The improved adhesion provided by the DAF 102 prevents die 104 shift after a pick and place process to adhere the dies 104 to the carrier wafer 100 via the DAF 102 and also after thermal processes. The DAF 102 is moisture-proof and thus provides a moisture proof-barrier on the back side 103b of the dies 104. The DAF 102 also prevents and/or reduces sidewall chipping of the packaged semiconductor device 120, e.g., during singulation of the packaged semiconductor devices 120 or during further handling. The DAF 102 provides protection again photo pollution such as radiation, alpha particles, etc., and provides the benefit of the ability of laser marking in some embodiments. The DAF 102 is also beneficial to boundary flatness between the dies 104 and the molding compound 106, for example. The DAF 102 advantageously has compatible thermal stability and chemical resistance to aqueous processing and other processing for the packaged semiconductor device 120.

The optional tape 122 provides further advantages of providing the ability of laser marking, if the DAF 102 does not provide this feature, for example. The presence of the DAF 102 between the tape 122 and the dies 104 ensures a void-free attachment of the tape 122 to the dies 104, which is also beneficial.

Figure 10:
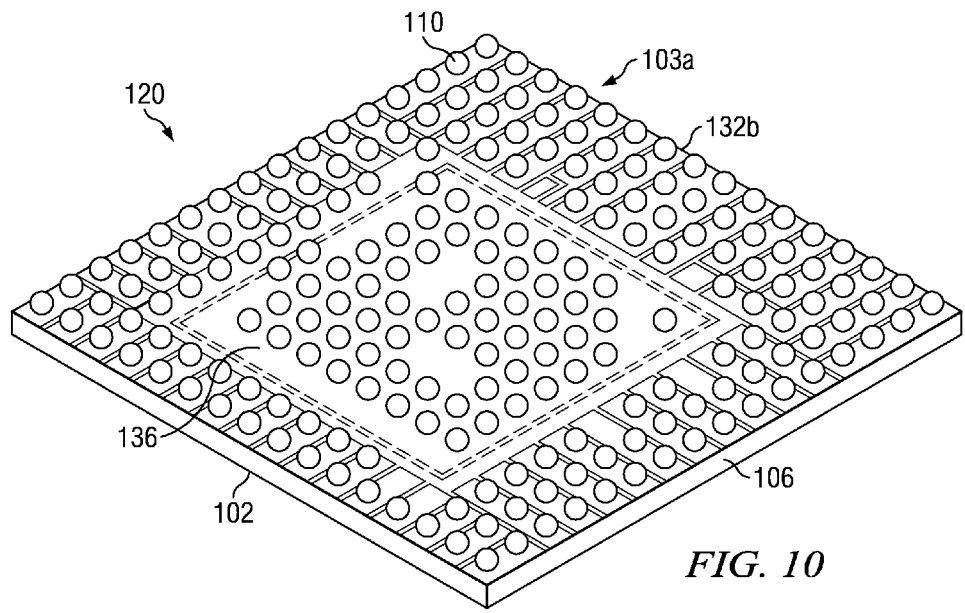
FIG. 10 shows a perspective view of the packaged semiconductor device of FIG. 9.

FIG. 10 shows a perspective view of the packaged semiconductor device 120 of FIG. 9. An example of a possible lay-out of solder balls 110 disposed over insulating layer 132b proximate the front side 103a of the die 104 (not shown in FIG. 9) is shown. A fan-out region 136 of the RDL 130 is disposed proximate a central region of the packaged semiconductor device 120, between the die 104 and the perimeter of the packaged semiconductor device 120. Molding compound 106 protects the edges of the packaged semiconductor device 120, i.e., die 104. The novel DAF 102 of embodiments of the present disclosure is disposed on the opposite side of the packaged semiconductor device 120 in the view shown.

FIGS. 11 through 20 illustrate cross-sectional views of a method of packaging semiconductor devices or dies 204 in a 3DIC chip-on-wafer package utilizing a DAF 202 at various stages in accordance with another embodiment of the present disclosure. Like numerals are used for the various elements in FIGS. 11 through 20 that were used to describe FIGS. 1 through 10. To avoid repetition, each reference number shown in FIGS. 11 through 20 is not described again in detail herein. Rather, similar materials x00, x02, x04, x06 etc., are used to describe the various material layers and components shown as were used to describe FIG. 1 through 10, where x=1 in FIGS. 1 through 10 and x=2 in FIGS. 11 through 20.

Figure 11:
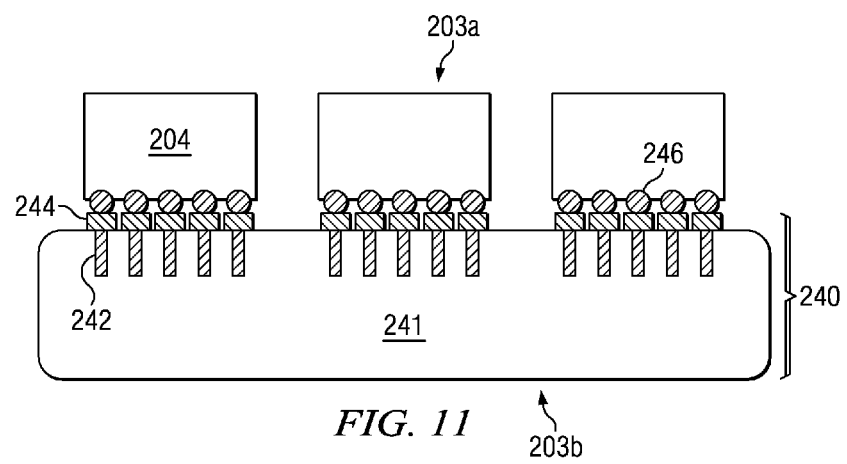

To package the dies 204, an interposer 240 is provided, as shown in FIG. 11. The interposer 240 comprises a semiconductive material 241 such as a silicon substrate, with a plurality of through-silicon vias (TSVs) 242 that are conductive formed therein. The TSVs 242 are also referred to herein as through-vias. The plurality of TSVs 242 is disposed at a surface of the interposer 240, as shown. A plurality of dies 204 is also provided. The plurality of dies 204 is coupled to the interposer 240 proximate the TSVs 242 disposed at the surface thereof.

The interposer 240 may include a plurality of bond pads 244 coupled to the plurality of TSVs 242, and the plurality of dies 204 may include a plurality of metal bumps 246 disposed on a surface thereof. Coupling the plurality of dies 204 to the interposer 240 may comprise coupling the plurality of metal bumps 246 of the plurality of dies 204 to the plurality of bond pads 244 of the interposer 240. Alternatively, the interposer 240 may be electrically coupled to the dies 204 using other connection means.

Figure 12:
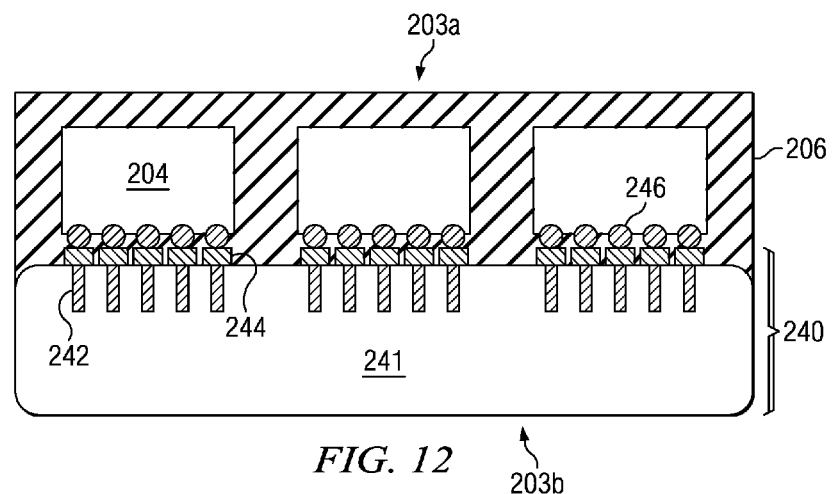
Figure 13:
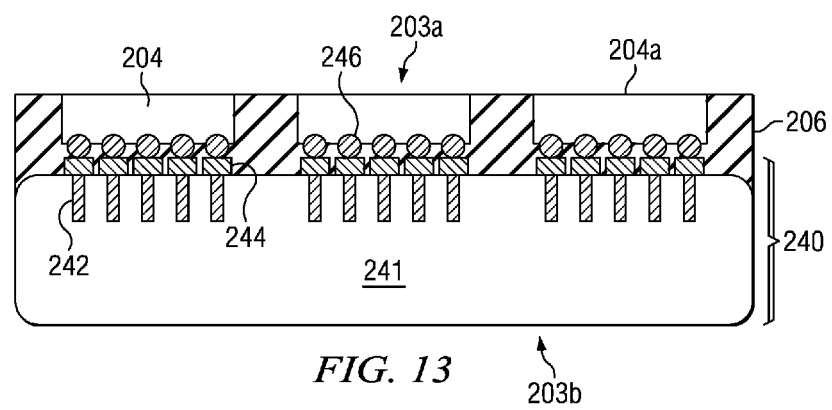

Next, molding compound 206 is formed over the plurality of dies 204, as shown in FIG. 12. In some embodiments, the molding compound 206 is removed at least from a surface 204a of the plurality of dies 204, as shown in FIG. 13. A top surface of the plurality of dies 204 may also be removed on the front side 203a, also shown. In other embodiments, a portion of the molding compound 206 may be left remaining on the surface of the dies 204. For example, the structure shown in FIG. 12 may be attached to a carrier wafer 200, not shown in the drawings.

Figure 14:
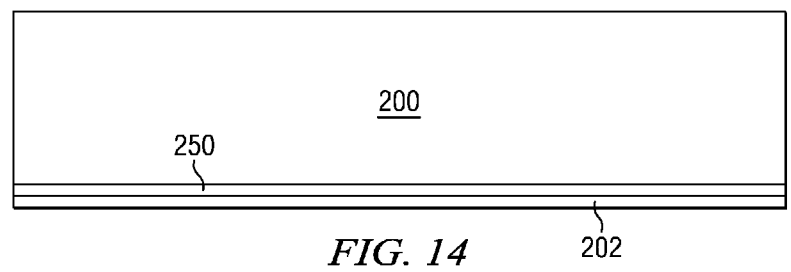

A carrier wafer 200 is then provided, as shown in FIG. 14, and an optional release film 250 may be formed over the carrier wafer 200. The release film 250 may comprise about a few microns of a light to heat conversion (LTHC) or thermal release film, as examples, although alternatively, the release film 250 may comprise other materials and dimensions. A DAF 202 is formed over the release film 250.

Figure 15:
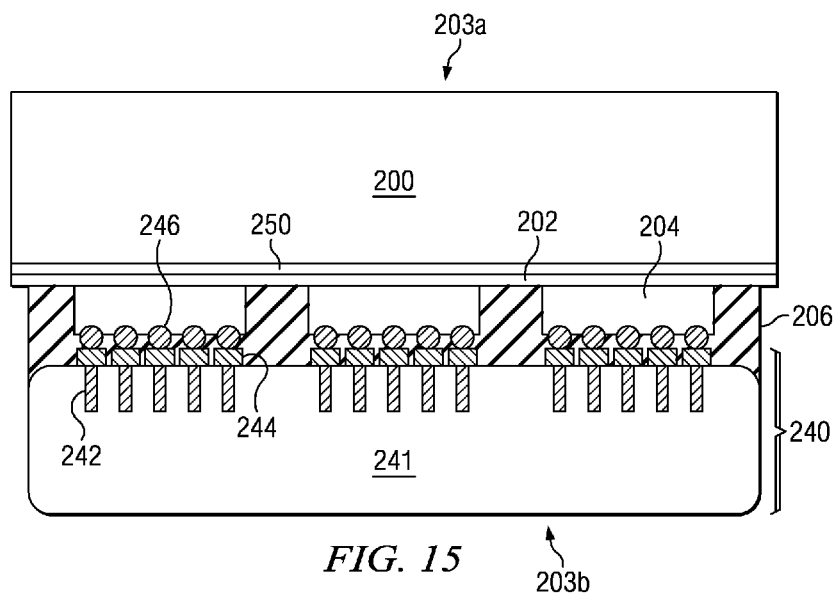
Figure 16:
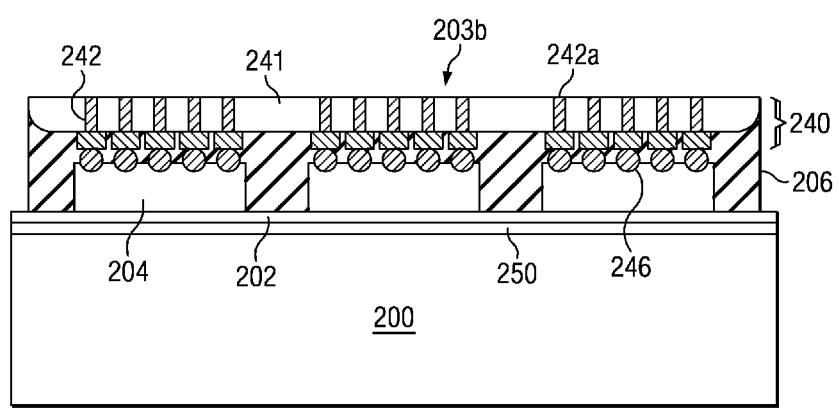
Figure 17:
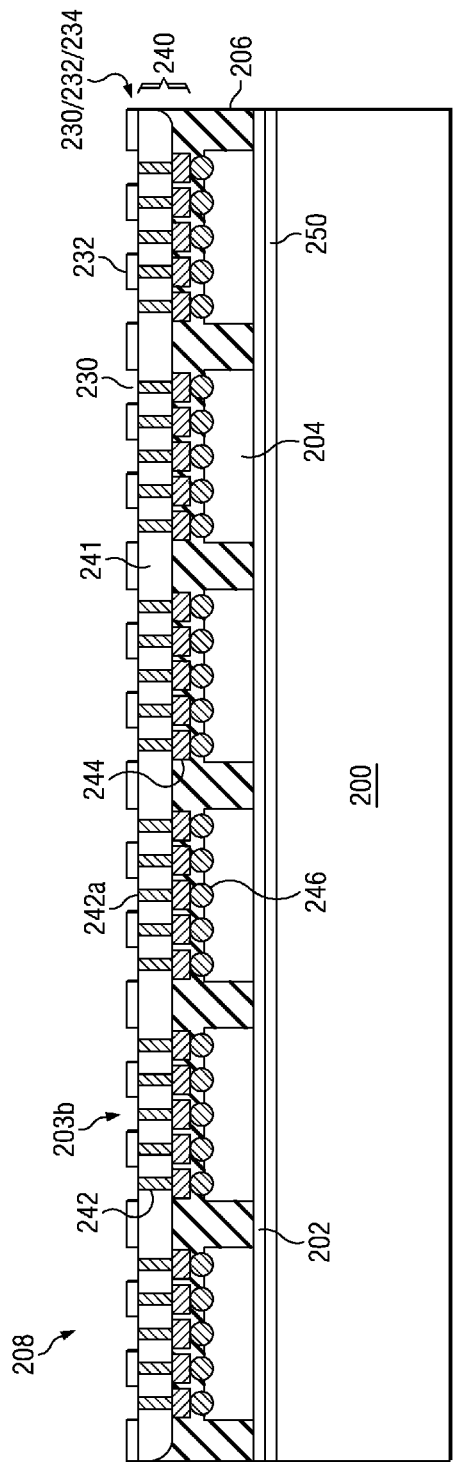
Figure 18:
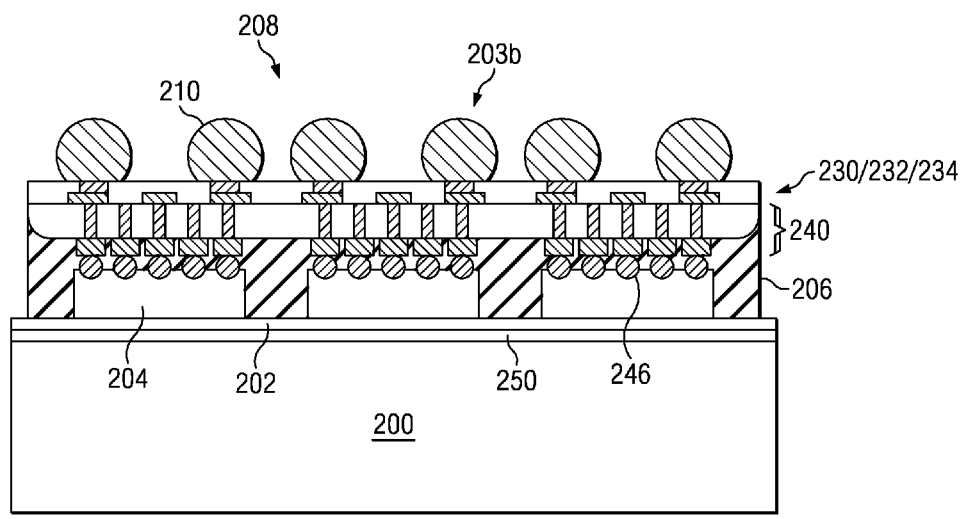

Next, the exposed surface (see surface 204a in FIG. 13) of the plurality of dies 204 may be attached to the DAF 202, as shown in FIG. 15 (or to the top of molding compound 206, not shown), using a thermal process with pressure in some embodiments, as described for the embodiment shown in FIGS. 1 through 10. A portion of a back side 203b of the interposer 240 is then removed, e.g., using a grinding process or other process, to expose surfaces 242a of the TSVs 242 of the interposer 240, as shown in FIG. 16. A wiring layer 208 comprising an RDL 230 is formed proximate the TSVs 242 of the interposer 240, as shown in FIG. 17. The wiring layer 208 may also include insulating layers 232 and a UBM structure 234 proximate the RDL 230, as shown. A plurality of solder balls 210 are formed over portions of the RDL 230, as shown in FIG. 18.

In this embodiment, at least the carrier wafer 200 and also the DAF 202 are removed from the packaged plurality of dies 204, leaving the structure shown in FIG. 19. The release film 250 is also removed. The release film 250 may be adapted to assist in the release of the DAF 202 from the carrier wafer 200, for example. The release film 250, DAF 202, and the carrier wafer 200 may be removed using light (e.g., a laser) or a thermal process to de-bond the carrier wafer 200, the release film 250, and the DAF 202 from the dies 204 and molding compound 206, for example.

Figure 20:
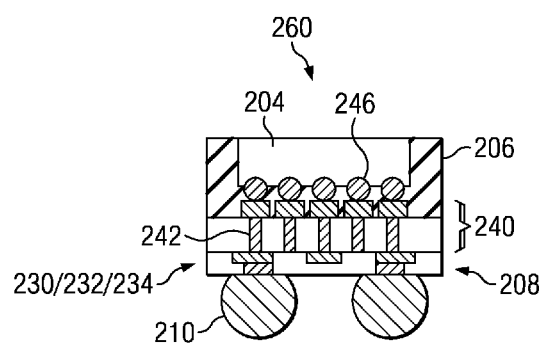

A tape 212 may be applied to the solder balls 210, and the packaged plurality of dies 204 is then singulated at singulation lines 214, leaving the packaged semiconductor device 260 shown in FIG. 20. The interposer 240, molding compound 206, wiring layer 208, and solder balls 210 comprise a 3DIC package for the dies 204, forming the packaged semiconductor device 260 in this embodiment.

Advantages of the embodiments shown in FIGS. 11 to 20 include preventing and/or reducing warping of the molding compound 206 after thermal processing and improving adhesion between the carrier wafer 200 and dies 204, due to the presence of the DAF 202 on the carrier wafer 200. The DAF 202 prevents and/or reduces sidewall cracks and chemical pollution. The DAF 202 also provides a moisture barrier during the packaging of the dies 204. The DAF 202 exhibits low out-gassing and contributes to achieving superior flatness between the carrier wafer 200 and the molding compound 206. The DAF 202 provides good adhesion and thermal stability to the packaging process for the dies 204 or semiconductor device.

Other advantages of embodiments of the disclosure include providing novel packaging techniques for semiconductor devices 104 and 204 that achieve higher yields and improved reliability due to the high adhesion quality of the DAF 102/202 during the packaging process using embodiments of the present disclosure. The novel packaging methods for semiconductor devices 104 and 204 are easily implemented in manufacturing and packaging process flows.

Embodiments of the present disclosure include the methods of packaging semiconductor devices or dies 104 and 204 described herein, and also include packaged semiconductor devices 120 and 260 that have been packaged using the methods and materials described herein.

A variety of different package types would benefit from attaching a carrier wafer 100/200 to devices such as dies 104/204 to be packaged using the DAF 102/202 described herein. The novel packaging techniques and DAF 102/202 may be implemented in other WLP designs and packaging processes, other 3DIC package designs and packaging processes, other TSV package designs and packaging processes, bump-on-trace (BOT) packages and packaging processes, or chip-on-wafer assembly packages and packaging processes, as examples.

In accordance with one embodiment of the present disclosure, a method of packaging a semiconductor device includes providing a carrier wafer and forming a DAF that includes a polymer over the carrier wafer. A plurality of dies is attached to the DAF, and the plurality of dies is packaged. At least the carrier wafer is removed from the packaged dies, and the packaged dies are singulated.

In another embodiment, a method of packaging a semiconductor device includes providing a carrier wafer and forming a DAF over the carrier wafer, the DAF comprising a thermoplastic material. A plurality of dies is attached to the DAF, and a molding compound is formed over the plurality of dies and exposed portions of the DAF. The molding compound is removed from at least from a top surface of the plurality of dies. An RDL is formed over the top surface of the plurality of dies, and a plurality of solder balls is formed over portions of the RDL. At least the carrier wafer is then removed from the packaged plurality of dies.

In yet another embodiment, a packaged semiconductor device includes at least one die and a wiring layer coupled to a first side of the at least one die. A DAF is coupled to a second side of the at least one die. The DAF comprises a polymer. A molding compound is disposed between the wiring layer and the DAF proximate edges of the at least one die.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of packaging a semiconductor device, the method comprising:
   providing a carrier wafer;
   forming a die attach film (DAF) over the carrier wafer, the DAF comprising a polymer;
   attaching a plurality of dies to the DAF;
   packaging the plurality of dies;
   removing at least the carrier wafer from the packaged dies; and
   singulating the packaged dies after removal of the carrier, each of the packaged dies retaining a segment of the die attach film after singulation.

2. The method according to claim 1, wherein forming the DAF over the carrier wafer comprises forming a thermoplastic material.

3. The method according to claim 2, wherein forming the thermoplastic material comprises forming epoxy resin, phenol resin, or poly-olefin.

4. The method according to claim 1, wherein the step of packaging includes at least partially encapsulating the respective plurality of dies in a molding compound.

5. The method according to claim 2, wherein attaching the plurality of dies to the DAF comprises heating the DAF and applying pressure to the DAF.

6. The method according to claim 5, wherein heating the DAF comprises heating the DAF to a temperature of about 150 to 270 degrees C. for about 1 second to 2 minutes.

7. The method according to claim 5, wherein applying pressure to the DAF comprises applying a pressure of about 1 Newton (N) or greater.

8. The method according to claim 1, further comprising forming a release film over the carrier wafer, before forming the DAF over the carrier wafer.

9. The method according to claim 1, further comprising marking the DAF.

10. The method according to claim 9, wherein marking the DAF comprises marking on the DAF of at least one of the packaged dies with a laser.

11. The method according to claim 1, further comprising forming a tape over the DAF, before singulating the packaged dies.

12. A method of packaging a semiconductor device, the method comprising:
   providing a carrier wafer;
   forming a die attach film (DAF) over the carrier wafer, the DAF comprising a thermoplastic material;
   attaching a plurality of dies to the DAF;
   forming a molding compound over the plurality of dies and exposed portions of the DAF;
   removing the molding compound at least from a top surface of the plurality of dies;
   forming a redistribution layer (RDL) over the top surface of the plurality of dies;
   forming a plurality of solder balls over portions of the RDL;
   removing at least the carrier wafer;

providing an interposer including a plurality of through-vias disposed at a surface thereof;

coupling the plurality of dies to the interposer proximate the through-vias; and removing a portion of a back side of the interposer to expose the through-vias of the interposer, before removing at least the carrier wafer.

13. The method according to claim 12, wherein the step of forming a die attach film (DAF) over the carrier wafer DAF includes applying a material selected from the group consisting of epoxy resin, phenol resin, poly-olefin, and combinations thereof.

14. A packaged semiconductor device, comprising:

at least one die;

a wiring layer coupled to a first side of the at least one die;

a die attach film (DAF) coupled to a second side of the at least one die, the DAF extending laterally beyond the die and comprising a polymer; and a molding compound disposed between the wiring layer and the DAF proximate edges of the at least one die, a first surface of the molding compound level with the first surface of the at least one die, the molding compound engaging a first surface of the die attach film disposed laterally beyond the die, a sidewall of the DAF being coplanar with a sidewall of the molding compound such that the sidewall of the DAF is directly above the sidewall of the molding compound.

15. The packaged semiconductor device according to claim 14, further comprising a plurality of solder balls coupled to the wiring layer.

16. The packaged semiconductor device according to claim 14, wherein the DAF comprises at least a portion of the package.

17. The packaged semiconductor device according to claim 14, wherein the DAF comprises a thermoplastic material.

18. The packaged semiconductor device according to claim 14, wherein the DAF comprises a thickness of about 10 μm.

19. The packaged semiconductor device according to claim 14, wherein the DAF comprises epoxy resin, phenol resin, or poly-olefin.

20. The packaged semiconductor device according to claim 14, further comprising a plurality of solder balls directly on the wiring layer.

* * * * *